(12) United States Patent
Eckberg et al.

(10) Patent No.: US 7,684,196 B2
(45) Date of Patent: Mar. 23, 2010

(54) ENHANCING THE COOLING OF DUAL IN-LINE MEMORY MODULES

(75) Inventors: Eric Alan Eckberg, Rochester, MN (US); Maurice Francis Holahan, Lake City, MN (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 12/119,857

(22) Filed: May 13, 2008

(65) Prior Publication Data

US 2009/0284928 A1   Nov. 19, 2009

(51) Int. Cl.
*H05K 7/20* (2006.01)

(52) U.S. Cl. .................. 361/707; 361/704; 361/715; 361/719; 361/721; 165/80.3; 165/104.33; 165/185; 257/717; 257/718; 257/719; 174/16.3; 174/252

(58) Field of Classification Search ............ 361/679.46, 361/679.51, 690–697, 704–712, 715, 717–724, 361/736, 759, 737; 165/80.2, 80.3, 104.33, 165/185; 257/717, 718, 726, 727; 174/15.1, 174/16.3, 252; 439/65, 139, 149, 940, 485–487; 29/832, 835, 840, 842
See application file for complete search history.

(56) References Cited

U.S. PATENT DOCUMENTS

| | | | |
|---|---|---|---|
| 5,966,287 A * | 10/1999 | Lofland et al. | 361/704 |
| 6,188,576 B1 * | 2/2001 | Ali et al. | 361/704 |
| 6,222,739 B1 * | 4/2001 | Bhakta et al. | 361/790 |
| 6,233,150 B1 * | 5/2001 | Lin et al. | 361/704 |
| 6,424,532 B2 * | 7/2002 | Kawamura | 361/708 |
| 7,079,396 B2 * | 7/2006 | Gates et al. | 361/719 |
| 7,092,252 B2 * | 8/2006 | Robertson | 361/690 |
| 7,106,595 B2 * | 9/2006 | Foster et al. | 361/721 |
| 7,312,996 B2 * | 12/2007 | Chang | 361/704 |
| 7,345,882 B2 * | 3/2008 | Lee et al. | 361/710 |
| 7,379,297 B2 * | 5/2008 | Peterson et al. | 361/690 |
| 7,400,506 B2 * | 7/2008 | Hoss et al. | 361/715 |
| 7,403,383 B2 * | 7/2008 | McGuff et al. | 361/688 |

* cited by examiner

*Primary Examiner*—Michael V Datskovskiy
(74) *Attorney, Agent, or Firm*—Dillon & Yudell LLP; Robert R. Williams

(57) ABSTRACT

An apparatus for enhancing the cooling of a dual in-line memory module (DIMM) includes a planar body having opposing surfaces, a top edge, a bottom edge, and opposing ends. An engagement flange is connected to the bottom edge of the body. A first clip leg is connected to the engagement flange. The first clip leg includes a tab arranged to engage one mounting latch recess of the DIMM. A second clip leg connected to the engagement flange. The second clip leg includes a tab arranged to engage the other mounting latch recess of the DIMM.

18 Claims, 4 Drawing Sheets

ENHANCING THE COOLING OF DUAL IN-LINE MEMORY MODULES

BACKGROUND OF THE INVENTION

1. Technical Field

The present invention relates generally to the field of computer cooling, and more particularly to an apparatus and method for enhancing the cooling of dual in-line memory modules.

2. Description of the Related Art

Dual in-line memory modules (DIMMs) are a dominant form of packaging dynamic random access memory (DRAM) modules in computer server applications. Multiple DIMMs are normally placed in parallel, on a narrow pitch (9 to 12 mm), and in close proximity to high-powered CPU processors. Multiple DIMMs may be configured in a variety of capacities and form factors, creating a mixture of differing airflow geometries in the same system. A system with a 12 DIMM capacity may be populated with 12 DIMMs. However, a system with 12 slots may include only 4 DIMMs and 8 vacant slots. As another example, a system with 12 slots may include eight single-high and four double-high DIMM form factors.

Vacant slots and/or mixtures of DIMM card heights present regions of relatively low air flow impedance in parallel with much more restrictive flow channels. The effect of this imbalance, since air takes the path of least resistance, is flow starvation in regions of higher DRAM density. This flow starvation may result in component overheating, reduced reliability, and loss of function.

Existing solutions include increasing fan/blower flow delivery and obstructing the open channels with foam blocks or other filler designs. The drawbacks of increasing fan output to offset the flow bypass imbalance include increased acoustic noise level, increased electrical power consumption, increased air moving device size and cost, and increased bearing temperatures. The drawbacks of complete obstruction of open channels with foam blocks or the like include increased overall system pressure drop, which results in the same disadvantages as listed above for increasing fan output, and increased heating of downstream or upstream components, as the mass flow rate is reduced as a result of increased pressure drop. Typically, the flow through the DIMM bank area is passed serially through a high-power CPU region and therefore cannot be overly restrictive.

Existing DIMM fillers provide some degree of flow balancing; however, they do not handle combinations of multiple height DIMMs, and they lack any means of focusing the flow over a hub chip. In order to provide the same amount of cooling to a hub chip, prior art fillers require much higher airflow rates. On-DIMM hub chips are a relatively recent addition to memory DIMMs, having been added to increase memory speed and capacity as processor architectures increasingly improve bandwidth access to memory. Overheating of memory DIMMs is currently a problem for DDR2 DIMMs and is expected to get worse for the next generations of DIMMs (DDR3 and DDR4) because DRAM device powers and CPU preheat are increasing, while the industry allowable temperature limit for single-refresh DRAMs remains fixed at 85° C.

SUMMARY OF THE INVENTION

The present invention provides an apparatus for enhancing the cooling of dual in-line memory modules (DIMMs). A DIMM includes a circuit card having a thickness defined by opposing surfaces. The circuit card includes a top edge, a bottom edge, and opposing ends. Each of the ends includes a mounting latch recess.

The apparatus includes a planar body having opposing surfaces, a top edge, a bottom edge, and opposing ends. An engagement flange is connected to the bottom edge of the body. A first clip leg is connected to the engagement flange. The first clip leg includes a tab arranged to engage one of the mounting latch recesses of the DIMM. A second clip leg connected to the engagement flange. The second clip leg includes a tab arranged to engage the other of the mounting latch recesses of the DIMM. The first and second clip legs may be flexible.

A first engagement member may be connected to the engagement flange and arranged to engage one surface of the circuit card. A second engagement member may be connected to the engagement flange and arranged to engage the opposite surface of the circuit card. A plurality of ribs may be connected to the surfaces of the body. A first flow concentrator may be connected to one surface of the body and a second flow concentrator may be connected to the opposite surface of the body. The first and second flow concentrators may be arcuate.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF THE PREFERRED EMBODIMENT

Figure 1:
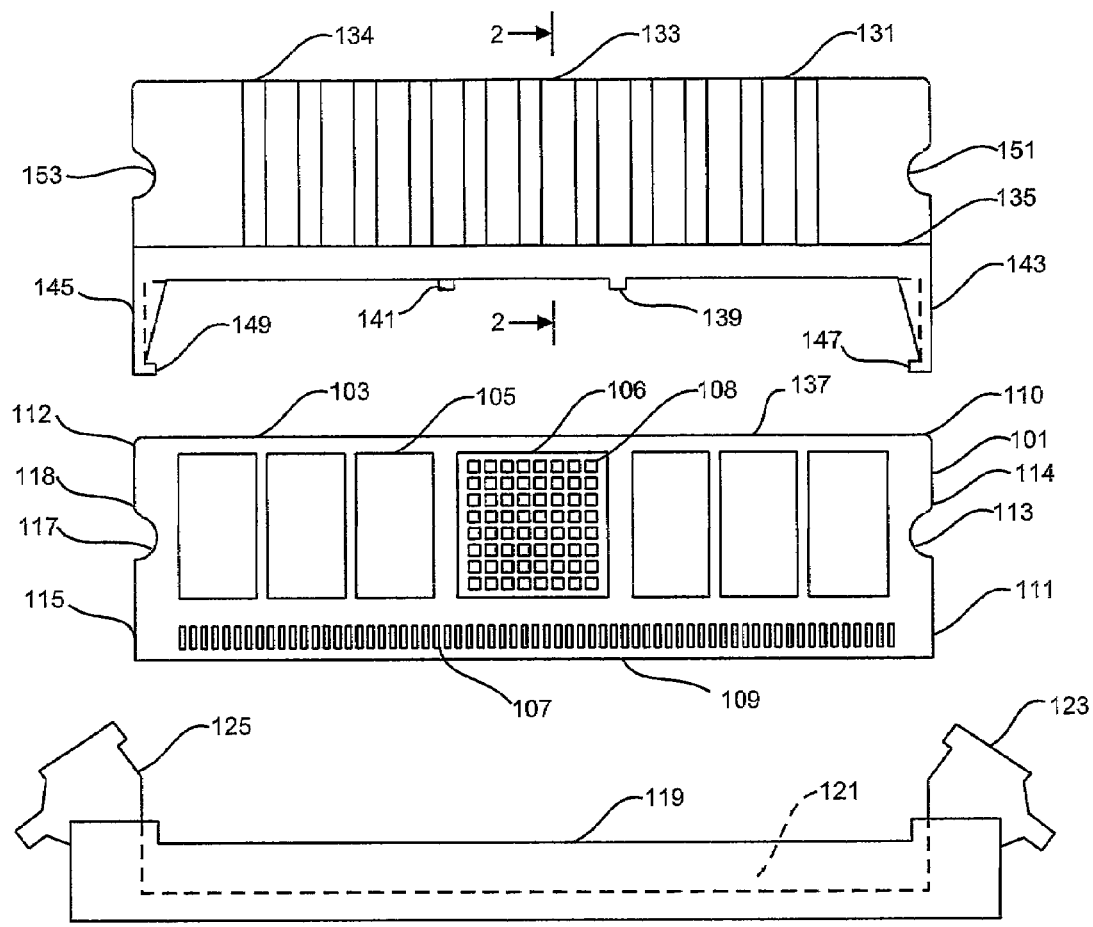
FIG. 1 is a side view of an embodiment of an apparatus according to the present invention position above a DIMM and a mounting base.
Figure 2:
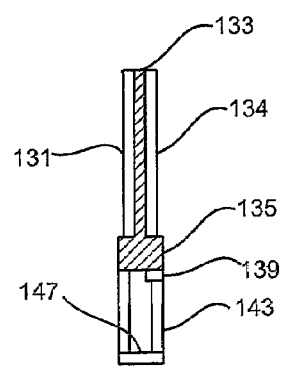
FIG. 2 is a section view taken along line 2-2 of FIG. 1.

Referring now to the drawings, and first to FIGS. 1-4, a dual in-line memory module (DIMM) is designated generally by the numeral 101. The structure of DIMMs is well known to those skilled in the art. Generally, DIMM 101 includes a generally rectangular printed circuit card 103 upon which are mounted a plurality of dynamic random access memory (DRAM) devices 105. DIMM 101 may also include a hub chip 106. Hub chip 106 typically includes a heat sink 108. DRAMs 105 are mounted on both surfaces of printed circuit card 103. Printed circuit card 103 includes circuitry (not shown) that connects DRAMs 105 to a plurality of connectors 107 positioned adjacent the lower edge 109 of printed circuit card 103. One end 111 of printed circuit card 103 includes a mounting latch recess 113. Similarly, the other end 115 of printed circuit card 103 includes a mounting latch recess 117.

DIMM 101 is adapted to be mounted to a mounting base 119. As is known to those skilled in the art, mounting base 119 is mounted on a computer system motherboard (not shown).

Figure 3:
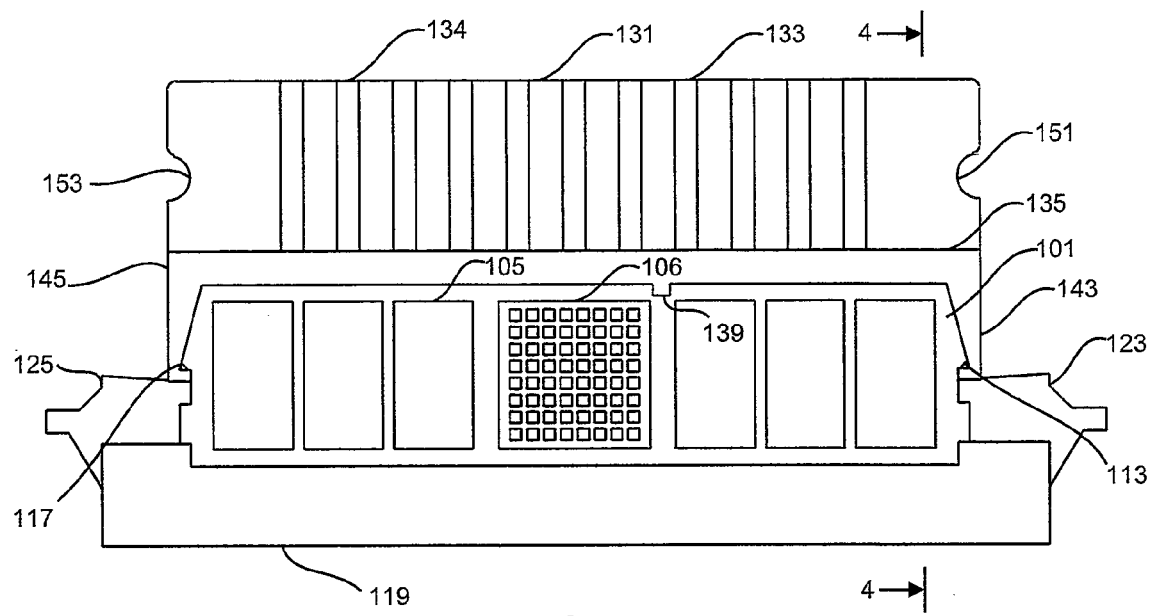
FIG. 3 is a side view of the embodiment of FIG. 1 mounted on the DIMM.

Mounting base 119 includes a connector slot 121 that receives lower edge 109 and connectors 107 of circuit card 103. A first latch 123 is pivotally mounted to one end of mounting base 119. Similarly, a second latch 125 is pivotally mounted to the other end of mounting base 119. Latches 123 and 125 are moveable between an open position, as shown in FIG. 1, and a closed position, as shown in FIG. 3. In the open position, circuit card 103 may be inserted into and removed from connector slot 121. In the closed position, latches 123 and 125 engage recesses 113 and 117, respectively, of circuit card 103 to latch DIMM 101 to mounting base 119, as shown in FIG. 3.

An embodiment of an apparatus according to the present invention is designated generally by the numeral 131. Apparatus 131 includes a planar, generally rectangular, body member 133. Body member 133 may be formed of material such as plastic. Body member has about the same width and thickness as circuit card 103 of DIMM 101. Body member 133 may include a plurality of vertical ribs 134 positioned on both surfaces of body member 133. Ribs 134 cause a series of contractions and expansions in the air flow stream passing over them. The thickness, number, and spacing of ribs 134 may be adjusted to match the air flow impedance of the flow over DRAMs 105. Ribs 134 may be molded directly into body member 133. While straight ribs are shown, the ribs may be slanted or curved to form vanes to direct the flow air toward the DRAMs. It is also possible to hollow out the ribbed region and install a set of angled louver slats to divert the flow air horizontally from one channel to an adjacent channel.

Apparatus 131 includes an engagement flange 135 connected to body member 133. Engagement flange 135 is adapted to engage the top edge 137 of circuit card 101. Engagement flange 135 includes a first engagement member 139 and a second engagement member 141. Engagement members 139 and 141 are positioned to engage the opposing surfaces of circuit card 101. Engagement flange 135 also includes a first clip leg 143 and a second clip leg 145. Clip legs 143 and 145 include locking tabs 147 and 149, respectively, which are adapted to engage recesses 113 and 117, respectively, as best shown in FIG. 3.

Figure 4:
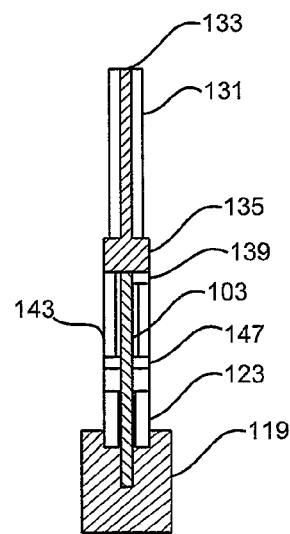
FIG. 4 is a section view taken along line 4-4 of FIG. 3.

In the embodiment of FIGS. 1-4, apparatus 131 is a unitary structure formed of plastic or the like. Thus, legs 143 and 145 are flexible so as to be deflected outwardly when apparatus 131 is mounted to circuit card 103. Tabs 147 and 149 ride along the ends of circuit card 103 and then snap into recesses 113 and 117, respectively, thereby locking apparatus 131 to circuit card 103, as shown in FIGS. 3 and 4. The upper corners 110 and 112 of circuit card 103 are preferably radiused so that tabs 147 and 149 do not ride over sharp corners as they inserted onto circuit card 103. Similarly, the upper corners 114 and 118 of recesses 113 and 117, respectively, are preferably radiused so that tabs 147 and 149 do not snap over sharp corners as they enter recesses 113 and 117. The radius prevents material from breaking off tabs 147 and 149 or card 103. An example of a radius is 0.5 mm.

Figure 5:
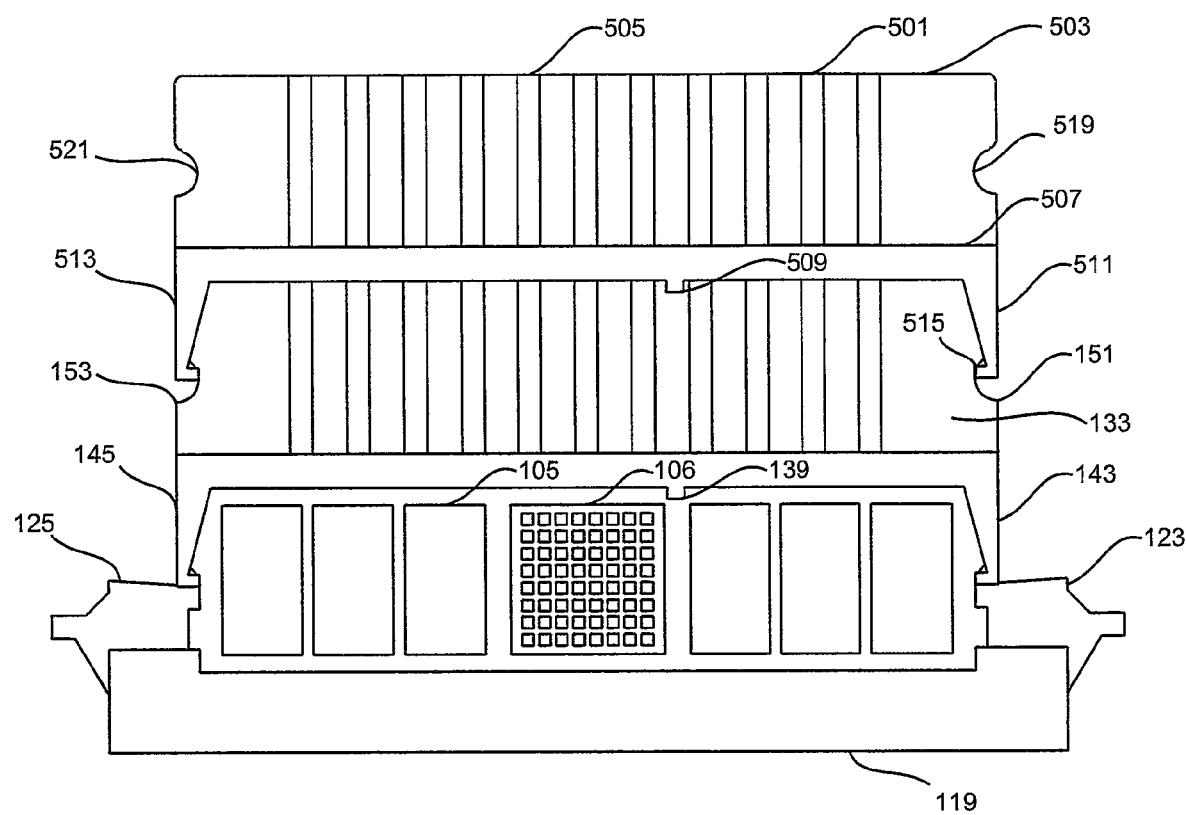
FIG. 5 is a side view illustrating two of the embodiments of FIG. 1 mounted on the DIMM.

Apparatus 131 may include a first recess 151 in one end of body member 133 and a second recess 153 in the other end of body member 133. As shown in FIG. 5, a second apparatus 501 may be mounted on apparatus 131. Apparatus 501 is identical to apparatus 131. Apparatus 501 includes a body member 503. Body member 503 may include a plurality of vertical ribs 505 positioned on both surfaces of body member 503. As shown in the drawings, the corners of body member 133 may be radiused in the same way as those of circuit card 103.

Apparatus 501 includes an engagement flange 507 connected to body member 503. Engagement flange 507 is adapted to engage the top edge apparatus 131. Engagement flange 507 includes a first engagement member 509 and a second engagement member (not shown). The engagement members are positioned to engage the opposing surfaces of body member 133 of apparatus 131. Engagement flange 507 also includes a first clip leg 511 and a second clip leg 513. Clip legs 511 and 513 include locking tabs 515 and 517, respectively, which are adapted to engage recesses 151 and 153.

Apparatus 501 is preferably a unitary structure formed of plastic or the like. Legs 511 and 513 are flexible so as to be deflected outwardly when apparatus 501 is mounted to apparatus 131. Tabs 515 and 517 ride along the ends of body member 133 and then snap into recesses 151 and 153, respectively, thereby locking apparatus 501 to apparatus 131, as shown in FIG. 5.

Apparatus 501 includes a first recess 519 in one end of body member 503 and a second recess 521 in the other end of body member 503. Accordingly, multiple apparatus such as apparatus 501 and 131 may be stacked on top of each other.

Figure 6:
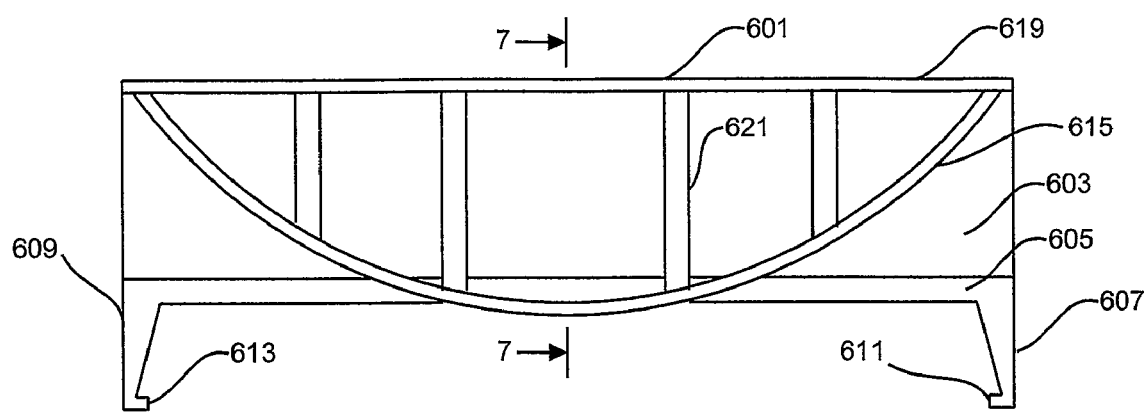
FIG. 6 is a side view of a second embodiment of an apparatus according to the present invention; and, FIG. 7 is a section view taken along line 7-7 of FIG. 6.
Figure 7:
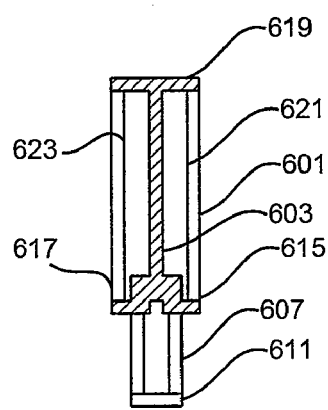

FIGS. 6 and 7 illustrate a second embodiment of an apparatus 601 according to the present invention. Apparatus 601 includes a planar, generally rectangular, body member 603. Apparatus 601 includes an engagement flange 605 connected to body member 603. Engagement flange 605 is adapted to engage the top edge 137 of circuit card 101. Engagement flange 605 also includes a first flexible clip leg 607 and a second flexible clip leg 609. Clip legs 607 and 609 include locking tabs 611 and 613, respectively, which are adapted to engage the latching recesses of a DIMM, as described with respect to the embodiment of FIGS. 1-5.

Apparatus 601 includes a first flow concentrator 615 and a second flow concentrator 617 positioned on opposites sides of body member 603. Flow concentrators 615 and 617 are arcuate or aerodynamic in cross-section and extend outwardly from body member 603. Flow concentrators 615 and 617 direct cooling air downwardly toward and increase the speed of the air over the devices mounted on a DIMM, particularly the hub chip (for example, hub chip 106 in FIG. 1). Additionally, flow concentrators 615 and 617 extend below engagement flange 605 to engage the circuit card of a DIMM when apparatus 601 is mounted on the DIMM. Apparatus 601 includes a top flange 619 and a plurality of ribs 621 and 623. Ribs 621 and 623 extend along the surfaces of body member 603 between top flange 619 and concentrator flanges 615 and 617, respectively.

From the foregoing, it will be apparent to those skilled in the art that apparatus and methods according to the present invention are well adapted to overcome the shortcomings of the prior art. While the present invention has been described with reference to presently preferred embodiments, those skilled in the art, given the benefit of the foregoing description, will recognize alternative embodiments. Accordingly, the foregoing description is intended for purposes of illustration and not of limitation.

What is claimed is:

1. An apparatus for enhancing cooling of a dual in-line memory module (DIMM), said DIMM including a circuit card having a thickness defined by opposing surfaces, and said circuit card including a top edge, a bottom edge, and opposing ends, each of said ends including a mounting latch recess, said apparatus comprising:
   a planar body, said body having opposing surfaces, a top edge, a bottom edge, and opposing ends;
   means for engaging said top edge of a DIMM;
   a first clip leg connected to said body, said first clip leg including a tab arranged to engage one of said mounting latch recesses of said DIMM; and, a second clip leg connected to said body, said second clip leg including a tab arranged to engage the other of said mounting latch recesses of said DIMM.

2. The apparatus as claimed in claim 1, wherein said first and second clip legs are flexible.

3. The apparatus as claimed in 1, wherein said means for engaging said top edge of said DIMM includes:
a first engagement member connected to said body and arranged to engage one surface of said circuit card; and,
a second engagement member connected to said body and arranged to engage the opposite surface of said circuit card.

4. The apparatus as claimed in claim 1, further comprising:
a plurality of ribs connected to said surfaces of said body.

5. The apparatus as claimed in claim 1, further comprising:
a first flow concentrator connected to one surface of said body.

6. The apparatus as claimed in claim 5, further comprising:
a second flow concentrator connected to the opposite surface of said body.

7. The apparatus as claimed in claim 5, wherein said first flow concentrator is arcuate.

8. The apparatus as claimed in claim 1, further comprising:
a first clip recess formed in one end of said body; and,
a second clip recess formed in the other end of said body.

9. The apparatus as claimed in claim 1, wherein means for engaging said top edge of said DIMM includes:
an engagement flange connected to said bottom edge of said body;
a first engagement member connected to said engagement flange and arranged to engage one surface of said circuit card; and,
a second engagement member connected to said engagement flange and arranged to engage the opposite surface of said circuit card.

10. The apparatus as claimed in 9, wherein said first and second leg clips are connected to said engagement flange.

11. A method of enhancing cooling of a dual in-line memory module (DIMM), said DIMM including a circuit card having a thickness defined by opposing surfaces, and said circuit card including a top edge, a bottom edge, and opposing ends, each of said ends including a mounting latch recess, said method comprising:
attaching a planar body having opposing surfaces, a top edge, a bottom edge, and opposing ends to said circuit card such that said body extends parallel to and in alignment with said circuit card along said top edge of said circuit card;
positioning a first flow concentrator one surface of said body; and
positioning a second flow concentrator on the other surface of said body.

12. The method as claimed in claim 11, wherein:
said flow concentrators are arcuate.

13. An apparatus for enhancing cooling of a dual in-line memory module (DIMM), said DIMM including a circuit card having a thickness defined by opposing surfaces, and said circuit card including a top edge, a bottom edge, and opposing ends, each of said ends including a mounting latch recess, said apparatus comprising:
a planar body, said body having opposing surfaces, a top edge, a bottom edge, and opposing ends;
an engagement flange connected to said bottom edge of said body;
a first clip leg connected to said engagement flange, said first clip leg including a tab arranged to engage one of said mounting latch recesses of said DIMM; and,
a second clip leg connected to said engagement flange, said second clip leg including a tab arranged to engage the other of said mounting latch recesses of said DIMM.

14. The apparatus as claimed in claim 13, wherein said first and second clip legs are flexible.

15. The apparatus as claimed in 13, further comprising:
a first engagement member connected to said engagement flange and arranged to engage one surface of said circuit card; and,
a second engagement member connected to said engagement flange and arranged to engage the opposite surface of said circuit card.

16. The apparatus as claimed in claim 13, further comprising:
a plurality of ribs connected to said surfaces of said body.

17. The apparatus as claimed in claim 16, further comprising:
a first flow concentrator connected to one surface of said body; and,
a second flow concentrator connected to the opposite surface of said body.

18. The apparatus as claimed in claim 16, wherein said first and second flow concentrators are arcuate.

* * * * *